United States Patent
Ohtani et al.

[11] Patent Number: 6,074,901
[45] Date of Patent: Jun. 13, 2000

[54] PROCESS FOR CRYSTALLIZING AN AMORPHOUS SILICON FILM AND APPARATUS FOR FABRICATING THE SAME

[75] Inventors: Hisashi Ohtani; Hiroki Adachi, both of Kanagawa, Japan

[73] Assignee: Semiconductor Energy Laboratory Co., Ltd., Japan

[21] Appl. No.: 08/483,063

[22] Filed: Jun. 7, 1995

Related U.S. Application Data

[63] Continuation-in-part of application No. 08/347,250, Nov. 23, 1994.

[30] Foreign Application Priority Data

Dec. 3, 1993 [JP] Japan ..................................... 5-339586

[51] Int. Cl.$^7$ ................................................ H01L 21/225
[52] U.S. Cl. ........................... 438/166; 438/486; 438/487
[58] Field of Search .................. 437/21, 40 TFT, 437/41 TFT, 101, 233, 967; 117/7, 8; 438/166, 486, 487, FOR 478

[56] References Cited

U.S. PATENT DOCUMENTS

| | | | |
|---|---|---|---|
| 4,328,258 | 5/1982 | Coleman . | |
| 4,985,722 | 1/1991 | Ushijima et al. . | |
| 5,043,299 | 8/1991 | Chang et al. ........................... | 438/908 |
| 5,061,144 | 10/1991 | Akimoto et al. . | |
| 5,147,826 | 9/1992 | Liu et al. ................................ | 437/233 |
| 5,275,851 | 1/1994 | Fonash et al. ......................... | 437/233 |
| 5,380,682 | 1/1995 | Edwards et al. ....................... | 438/908 |
| 5,403,397 | 4/1995 | Beckers et al. . | |

(List continued on next page.)

FOREIGN PATENT DOCUMENTS

| | | |
|---|---|---|
| 0478010 | 4/1992 | European Pat. Off. . |
| 3-280420 | 12/1991 | Japan . |

OTHER PUBLICATIONS

Wolf et al., Silicon Processing for the VLSI Era, vol. 1—Process Technology, Lattice Press, 1986, pp. 230–234.

T. Hempel et al., "Needle–Like Crystallization of Ni Doped Amorphous Silicon Thin Films", *Solid State Communications*, vol. 85, No. 11, pp. 921–924, 1993.

"Crystallized Si Films By Low–Temperature Rapid Thermal Annealing Of Amorphous Silicon", R. Kakkad, J. Smith, W.S. Lau, S.J. Fonash, J. Appl. Phys. 65 (5), Mar. 1, 1989, 1989 American Institute of Physics, p. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, p. 2554–2556.

"Selective Area Crystallization of Amorphous Silicon Films by Low–Temperature Rapid Thermal Annealing", Gang Liu and S.J. Fonash, Appl. Phys. Lett. 55 (7), Aug. 14, 1989, 1989 American Institute of Physics, p. 660–662.

"Low Temperature Selective Crystallization of Amorphous Silicon", R. Kakkad, G. Liu, S.J. Fonash, Journal of Non–Crystalline Solids, vol. 115, (1989), p. 66–68.

C. Hazelden et al., "In Situ Transmission Electron Microscopy Studies of Silicide–Mediated crystallization of Amorphous Silicon" (3 pages), J. Apply. Phys. (1993) 8279, 73, 12.

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, 1986, pp. 635–640.

*Primary Examiner*—Mary Wilczewski
*Attorney, Agent, or Firm*—Nixon Peabody LLP; Jeffrey L. Costellia

[57] ABSTRACT

In a process for crystallizing an amorphous silicon film at a low temperature using a catalyst element, a system which automatically introduces the catalyst element into the amorphous silicon film is provided. The process steps are necessary for applying a solution containing an element which accelerates the crystallization of an amorphous silicon film are each effected in units 14 to 21. The substrate is transferred using a robot arm 12.

33 Claims, 3 Drawing Sheets

U.S. PATENT DOCUMENTS

| | | | |
|---|---|---|---|
| 5,420,044 | 5/1995 | Kozuka | 438/908 |
| 5,478,780 | 12/1995 | Koerner et al. | 438/908 |
| 5,543,352 | 8/1996 | Ohtani et al. | 437/101 |
| 5,578,520 | 11/1996 | Zhang et al. | 438/908 |
| 5,643,826 | 7/1997 | Ohtani et al. | 438/166 |
| 5,654,203 | 8/1997 | Ohtani et al. | 438/166 |
| 5,789,284 | 8/1998 | Yamazaki et al. | 438/166 |
| 5,804,471 | 9/1998 | Yamazaki et al. | 438/154 |
| 5,821,138 | 10/1998 | Yamazaki et al. | 438/166 |
| 5,854,096 | 12/1998 | Ohtani et al. | 438/166 |
| 5,858,822 | 1/1999 | Yamazaki et al. | 438/166 |
| 5,869,363 | 2/1999 | Yamazaki et al. | 438/166 |
| 5,879,977 | 3/1999 | Zhang et al. | 438/166 |
| 5,894,137 | 4/1999 | Yamazaki et al. | 257/66 |
| 5,897,347 | 4/1999 | Yamazaki et al. | 438/166 |
| 5,923,962 | 7/1999 | Ohtani et al. | 438/150 |
| 5,923,966 | 7/1999 | Teramoto et al. | 438/162 |
| 5,923,968 | 7/1999 | Yamazaki et al. | 438/166 |
| 5,956,581 | 9/1999 | Yamazaki et al. | 438/166 | ns
PROCESS FOR CRYSTALLIZING AN AMORPHOUS SILICON FILM AND APPARATUS FOR FABRICATING THE SAME

This is a Continuation in Part application of Ser. No. 08/347,250 filed on Nov. 23, 1994.

DETAILED DESCRIPTION OF THE INVENTION

1. Industrial Field of Application

The present invention relates to a process for fabricating a thin film of a crystalline silicon semiconductor, and to an apparatus for use thereof.

2. Prior Art

Thin-film transistors (referred to simply hereinafter as "TFTs") are well known as devices that utilize thin-film semiconductors. The TFTs are fabricated by forming a thin-film semiconductor on a substrate and are constituted therewith. The TFTs are widely used in various types of integrated circuits, and are particularly noticed in the field of switching elements that are provided to each of the pixels of active matrix liquid crystal display devices as well as in driver elements of the peripheral circuits thereof.

Amorphous silicon film can be utilized most readily as thin-film semiconductors for TFTs. However, the electrical characteristics of the amorphous silicon film are inferior and thus disadvantageous for use. The characteristics of TFTs can be improved by the use of a silicon film having a crystallinity. A silicon film having a crystallinity is, for example, polycrystalline silicon, polysilicon, and microcrystalline silicon. A thin film of crystalline silicon can be formed by first forming a thin film of amorphous silicon, and then crystallizing it through heat treatment.

However, since the heat treatment for the crystallization of the amorphous silicon film requires heating the film at a temperature of 600° C. or higher for a duration of 10 hours or longer, there is a problem that it is difficult to use a glass as a substrate. For instance, Corning 7059 glass commonly used for the substrate of an active matrix liquid crystal display device has a glass distortion point of 593° C., and is therefore not suitable for large area substrates that are subjected to heating at a temperature of 600° C. or higher.

BACKGROUND OF THE INVENTION

In a study performed by the present inventors, it was found that crystallization of an amorphous silicon film can be effected by heating the film at 550° C. for a duration of about 4 hours by first depositing a trace amount of nickel or palladium, or other elements such as lead onto the surface of the amorphous silicon film and then heating it.

The elements above (catalyst elements capable of accelerating the crystallization) can be introduced by the use of plasma treatment or vapor deposition, or ion implantation. The plasma treatment is a method which comprises adding the catalyst elements into the amorphous silicon film by generating a plasma of an atmosphere such as nitrogen or hydrogen, using a material containing a catalyst element as an electrode(s) in a plasma CVD apparatus of a parallel plate type or of a positive column type.

However, it is not desirable to introduce a large amount of a catalyst elements since it hinders a reliability or electrical characteristics of a semiconductor device.

That is, the above mentioned element such as nickel which accelerate the crystallization (i.e. catalyst element) are necessary for the crystallization of the amorphous silicon film, but are preferably not incorporated in the crystallized silicon. These conflicting requirements can be accomplished by selecting, as the catalyst element, an element which tends to be inactive in crystalline silicon, and by incorporating the catalyst element in a minimum amount for the crystallization of the film. And for this purpose, the quantity of the catalyst element to be incorporated in the film needs to be controlled with high precision.

Also, in the case of using nickel as a catalyst element, a crystalline silicon film was fabricated by forming an amorphous silicon film and adding nickel through plasma treatment. The crystallization process and the like were studied in detail. The following findings were obtained as a result:

(1) In the case that nickel is introduced by plasma treatment onto an amorphous silicon film, nickel is found to penetrate into the amorphous silicon film to a considerable depth before the film is subjected to a heat treatment;

(2) The initial nucleation occurs from the surface from which the nickel is incorporated; and (3) When a nickel layer is deposited on the amorphous silicon film by vapor deposition, the crystallization occurs in the same manner as in the case of effecting plasma treatment.

It can be concluded from the above findings that not all of nickel atoms incorporated by plasma treatment into the amorphous silicon film function effectively. That is, even if a large amount of nickel is introduced, some of the nickel does not function sufficiently. Accordingly, it can be considered that the point (surface) at which the nickel contacts silicon functions during the low temperature crystallization. Conclusively, nickel needs to be dispersed as finely as possible in the form of atoms. In other words, it is concluded that "nickel needs to be introduced in the vicinity of the surface of an amorphous silicon film in the form of atoms dispersed at a minimum concentration which is necessary for the low temperature crystallization.

A trace amount of nickel, i.e., a catalyst element capable of accelerating crystallization of an amorphous silicon, can be introduced only in the vicinity of a surface of the amorphous silicon film by, for example, vapor deposition. However, vapor deposition is disadvantageous in terms of the controllability of the film, and is therefore not suitable for precisely controlling the amount of the catalyst element.

The aforementioned problem can be overcome by applying a solution containing a catalyst element onto the surface of an amorphous silicon film in order that a predetermined quantity of the catalyst element is adsorbed by the surface of the amorphous silicon film and then effecting the crystallization by a heat treatment.

In accordance with this method, the concentration of the catalyst element incorporated in the amorphous silicon film can be controlled precisely by adjusting the concentration of the catalyst element in the solution and the period of time during which the solution is brought into contact with the amorphous silicon film.

The use of a solution for introducing a catalyst has various advantages, however, there is also a shortcoming resulting from the simplicity of the process. That is, the process is particularly sensitive to a contamination with particles. This is because when particles are present on the surface of the substrate to be coated, the surface cannot be brought into sufficient contact with the solution.

Furthermore, the process requires a step of heat treatment using a diffusion furnace and the like after the step of adding the catalyst element. In this step, the inside of the diffusion furnace must be prevented from being contaminated by the catalyst element. Also from this point of view, the step of applying the solution to the substrate must be carried out under strict control.

Means for Solving the Problems

An object of the present invention is to provide a system for introducing a catalyst element using a solution through a sequence of steps.

FIG. 1 shows an apparatus according to an embodiment of the present invention. The apparatus allows a sequence of steps to be effected continuously in which a solution containing nickel is applied to the surface of a substrate having a thin film of amorphous silicon or to the surface on which a thin film of amorphous silicon is to be formed.

Referring to FIG. 1, the entire apparatus is composed of a plurality of units disposed on a base 11. A plurality of substrates (specifically, 20 substrates in this case) are held by a carrier 13, and are transferred by a robot arm 12 one by one to the units in which each of the processing steps is effected. The apparatus is wholly covered with a clean booth and the like to maintain the amount of particles inside the booth less than that in the outside, thereby, it is possible to suppress a contamination during processing.

The robot arm supports the substrate from the lower side. Thus, the surface of the substrate is not polluted by the robot arm.

The process for processing a glass substrate is described below. First, by using the robot arm 12, one glass substrate is taken out of the carrier 13 and is transferred to the positioning unit 18. The positioning unit accurately allocates the substrate on the robot arm 12. This step is necessary because, in a later step, a substrate is placed on a spinner using the robot arm and the center of the spinner must be aligned with that of the substrate.

After accurately positioning the substrate, the substrate is transferred to a cleaning unit 14. As a matter of course, the substrate is transferred using the robot arm 12. The cleaning unit 14 comprises a spinner. The substrate is cleaned with pure water while it is rotated by the spinner.

Upon completion of the cleaning, the substrate is transferred into a drying unit 15 using the robot arm 12 for drying. The drying unit 15 comprises a hot plate so that the substrate may be placed thereon and dried. The drying unit may otherwise have a constitution in which the substrate may be dried using hot air.

The substrate thus dried is then transferred to a cooling unit 16 by means of the robot arm 12. The cooling unit 16 is provided to cool the substrate which was heated in the drying step. The substrate is cooled by placing a substrate on a metal having a high thermal conductivity.

Upon completion of the cooling, the substrate is transferred to an oxidizing unit. In the oxidizing unit, ozone is generated using an ultraviolet radiation emitted from a low vapor pressure mercury lamp in gaseous oxygen so that the surface to be formed is oxidized. The oxidizing unit comprises a chamber with a door, because the oxidizing unit must be shut airtight after the substrate is placed therein. Thus, in the oxidizing unit, an extremely thin oxide film can be formed on the surface of the substrate.

The oxide film thus obtained functions in the later step of applying the solution, to improve the wettability with the solution, and also it functions as a support for adsorbing a compound containing a catalyst element.

The oxidizing unit may have a constitution for effecting thermal oxidation, or a constitution for effecting an oxidation using an oxidizing solution such as hydrogen peroxide.

After completing the oxidation, the substrate is transferred again to the positioning unit 18 to align the substrate. The substrate is then transferred to a coating unit 19. In the coating unit 19, a solution containing a catalyst element for accelerating the crystallization is applied to the surface of the substrate.

Specifically, a solution containing a catalyst element is applied to the surface of the substrate being placed on the spinner, following which spin-drying is carried out. Instead of using a spinner, the surface coated with the solution may be dried by blowing air or by heating.

The resulting substrate is dried thereafter in a drying unit 20 depending on necessity. This is because the drying in the coating unit 19 may be insufficient. If the method of drying in the drying units 15 and 20 is the same, either one of the units alone may be used.

In case the substrate is heated in the drying step, the substrate is transferred to a cooling unit 21 to cool the substrate. This step may be effected in the cooling unit 16.

The catalyst element is incorporated into the surface of the amorphous silicon film on the glass substrate in this manner. The substrate thus obtained is then transferred to a heating step without passing through cleaning step. Preferably, the transfer from this step to the heating step is effected in a cassette-to-cassette manner using a robot arm. Such a constitution is effective for circumventing the problems of particles and contaminations.

Referring again to FIG. 1, each of the units may be equipped with a positioning mechanism. Furthermore, though not shown in FIG. 1, a laser annealing unit for laser irradiation, a heat treatment unit for effecting a heat treatment, or a unit for rapid thermal annealing (RTA) using infrared radiation may be added. And, these units may be arranged in such a manner that the processes in each of the additional units are effected sequentially.

Next, the catalyst element and the solution for adding the catalyst element are explained below. The solution may be, for example, an aqueous solution, an organic solvent, etc. The catalyst element may be incorporated in the solution in the form of a compound that dissolves in the solution, or may be simply dispersed in the solution.

The solvent containing the catalyst element may be selected from polar solvents such as water, alcohol, acid, or ammonia.

In the case that nickel is used as the catalyst and a polar solvent is used, the nickel is incorporated in the form of a nickel compound. More specifically, it may be selected from a group of representative nickel compounds, nickel bromide, nickel acetate, nickel oxalate, nickel carbonate, nickel chloride, nickel iodide, nickel nitrate, nickel sulfate, nickel formate, nickel acetylacetonate, nickel 4-cyclohexylbutyrate, nickel oxide, and nickel hydroxide.

Also, it is possible to use a non-polar solvent for containing the catalyst element. For example, a solvent selected from benzene, toluene, xylene, carbon tetrachloride, chloroform, ether, trichloroethylene, and Freon can be used as well. It should be noted, however, that "polarity" is referred to herein not in a strict sense, but in a general sense based on chemical characteristics.

In this case again, nickel is incorporated in the solution in the form of a nickel compound. Representative compounds to be mentioned include nickel acetylacetonate and nickel 2-ethylhexanoate.

It is also useful to add a surface active agent (surfactant) into the solution containing the catalyst element. The surfactant increases the adhesion strength of the solution and controls the adsorptivity. The surfactant may be applied previously to the surface of the substrate onto which the amorphous silicon is deposited.

In case metallic nickel is used as the catalyst, it may be dissolved into an acid to form a solution.

The description above is for the case in which nickel is dissolved completely in a solution. Nickel needs not be completely dissolved in a solution, and other materials, such as an emulsion comprising metallic nickel or a nickel compound in the form of a powder dispersed in a dispersant, may be used as well.

The same as that mentioned in the foregoing applies to a case in which a catalyst element other than nickel is used.

In the case that nickel is used as the catalyst element for accelerating the crystallization of amorphous silicon, and a polar solvent such as water is used as a solvent, when the solution is directly applied to a thin film of amorphous silicon, the solution is sometimes repelled by the surface of the amorphous silicon. This can be circumvented by forming a thin oxide film of 100 Å or less in thickness, and then applying a solution containing the catalyst element thereon. In this manner, the solution can be coated uniformly. It is also useful to improve the wettability of the amorphous silicon with the solution by adding a surfactant and the like into the solution.

Also, a non-polar solvent such as a toluene solution of nickel 2-ethylhexanoate can be directly applied to a surface of an amorphous silicon film. It is effective in this case to previously apply an adhesive or a like material commonly used for forming a resist coating. However, such an agent must be treated with care, because the presence of an excessive amount of the additive obstructs the addition of a catalyst element inside the amorphous silicon.

The concentration of the catalyst element in the solution depends on the type of the solution, however, generally, the concentration of nickel by weight is from 1 ppm to 200 ppm, and preferably, from 1 ppm to 50 ppm. The concentration is determined based on the nickel concentration or the resistance against hydrofluoric acid of the film upon completion of the crystallization.

The crystal growth can be selectively performed by selectively applying the solution containing the catalyst element. In this case, the crystals can be grown approximately in parallel with the plane of the silicon film from the region onto which the solution is applied to the region onto which the solution is not applied. The region in which the crystals are grown in parallel with the plane of the amorphous silicon film is referred to hereinafter as "the region crystallized in a lateral direction".

It is also confirmed that this region crystallized in a lateral direction contains the catalyst element at a low concentration. It is useful to utilize a crystalline silicon film as an active layer region for a semiconductor device, however, in general, the concentration of the impurity in the active region is preferably as low as possible. Accordingly, the use of the region crystallized in a lateral direction for the active layer region is useful in fabricating a device.

The use of nickel as the catalyst element is particularly effective in the process according to the present invention. However, other useful catalyst elements include Ni, Pd, Pt, Cu, Ag, Au, In, Sn, Pd, Sn, Pd, P, As, and Sb. Otherwise, the catalyst element may be at least one selected from the elements belonging to the Groups VIII, IIIb, IVb, and Vb of the periodic table.

When iron (Fe) is selected as the catalyst element, an iron salt selected from compounds such as ferrous bromide ($FeBr_2.6H_2O$), ferric bromide ($FeBr_3.6H_2O$), ferric acetate ($Fe(C_2H_3O_2)_3.xH_2O$), ferrous chloride ($FeCl_2.4H_2O$), ferric chloride ($FeCl_3.6H_2O$), ferric fluoride ($FeF_3.3H_2O$), ferric nitrate ($Fe(NO_3)_3.9H_2O$), ferrous phosphate ($Fe(PO_4)_2.8H_2O$), and ferric phosphate ($FePO_4.2H_2O$) can be used.

In case cobalt (Co) is used as the catalyst element, useful compounds thereof include cobalt salts such as cobalt bromide ($CoBr.6H_2O$), cobalt acetate ($Co(C_2H_3O_2)_3.4H_2O$), cobalt chloride ($CoCl_2.6H_2O$), cobalt fluoride ($CoF_2.xH_2O$), and cobalt nitrate ($Co(NO_3)_2.6H_2O$).

A compound of ruthenium (Ru) can be used in the form of a ruthenium salt, such as ruthenium chloride ($RuCl_3.H_2O$).

A rhodium (Rh) compound is also usable in the form of a rhodium salt, such as rhodium chloride ($RhCl_3.3H_2O$).

A palladium (Pd) compound is also useful in the form of a palladium salt, such as palladium chloride ($PdCl_2.2H_2O$).

In case osmium (Os) is selected as the catalyst element, useful osmium compounds are osmium salts such as osmium chloride ($OsCl_3$).

If iridium (Ir) is selected as the catalyst element, a compound selected from iridium salts such as iridium trichloride ($IrCl_3.3H_2O$) and iridium tetrachloride ($IrCl_4$) can be used.

In case platinum (Pt) is used as the catalyst element, a platinum salt such as platinic chloride ($PtCl_4.5H_2O$) can be used as the compound.

In case copper (Cu) is used as the catalyst element, a compound selected from cupric acetate ($Cu(CH_3COO)_2$), cupric chloride ($CuCl_2.2H_2O$), and cupric nitrate ($Cu(NO_3)_2.3H_2O$) can be used.

In using gold (Au) as the catalyst element, it is incorporated in the form of a compound selected from auric trichloride ($AuCl_3.xH_2O$), auric hydrogenchloride ($AuHCl_4.4H_2O$), and sodium auric tetrachloride ($AuNaCl_4.2H_2O$).

The catalyst elements can be incorporated not only by using a solution such as an aqueous solution or an alcohol solution, but also by using a substance selected from a wide variety of materials containing the catalyst element. For instance, metal compounds and oxides containing the catalyst element can be used as well.

EXAMPLES

Example 1

The present example refers to a process which comprises applying a solution containing a catalyst element for accelerating the crystallization to the surface of a thin film amorphous silicon, and then crystallizing the thin-film amorphous silicon by heating.

Referring to FIG. 2, a process for fabricating a crystalline silicon film according to the present example is described below. In the present example, the process comprises incorporating a catalyst element (specifically, nickel in this case) into the amorphous silicon film. A Corning 7059 glass is used as a substrate. The size of the substrates is 100 mm×100 mm.

Initially, an amorphous silicon film from 100 to 1,500 Å in thickness is deposited by plasma CVD or LPCVD. In this case, an amorphous silicon film 12 is deposited at a thickness of 1,000 Å by plasma CVD (FIG. 2(A)).

Hereinafter, the substrate 201 having thereon a thin film amorphous silicon is simply referred to as "substrate". The process step for incorporating nickel into the surface of the amorphous silicon film 12 using the apparatus shown in FIG. 1 is described below.

Referring to FIG. 2(A), a plurality of substrates each having thereon an amorphous silicon film are placed on a carrier 13. A substrate is then transferred into a positioning unit 18 using a robot arm 12. The substrate is transferred thereafter to a cleaning unit 14. The substrate is then cleaned using pure water.

The substrate thus cleaned is transferred into a drying unit 15, and is dried at 120° C. for a duration of 90 seconds. Subsequently, the substrates are cooled for 5 seconds after transferring them into a cooling unit 16. The substrate is transferred again into the positioning unit 18 for positioning. The substrate is further transferred to an oxidizing unit 17, and is subjected to ultraviolet (UV) radiation for a duration of 5 minutes in gaseous oxygen. In this manner, an ultra thin oxide film 23 is formed on the surface of the amorphous silicon film.

Instead of using UV radiation, the oxide film can be formed on the surface by immersing the substrate having the amorphous silicon film into a hydrogen peroxide water heated to 70° C. for a duration of 5 minutes. Otherwise, an oxide film can be obtained by thermal oxidation.

The oxide film 12 is for sufficiently distributing the acetate solution on the entire surface of the amorphous silicon film in the later step of applying an acetate solution containing nickel, that is, for improving wettability. If the acetate solution is applied directly to the surface of the amorphous silicon film, for instance, the amorphous silicon film repels the acetate solution. In such a case, nickel cannot be incorporated into the entire surface of the amorphous silicon film. Conclusively, a uniformly crystallized film cannot be obtained.

After forming the oxide film 23, the substrate is transferred to a coating unit 19 where an acetate solution containing nickel is applied to the substrate. That is, an acetate solution containing nickel is applied to the surface of the amorphous silicon film 22 with an ultrathin oxide film 23 incorporated therebetween.

In the present invention, an aqueous acetate solution containing nickel at a concentration of 100 ppm by weight is used. Two milliliters of the resulting acetate solution are applied dropwise to the surface of the oxide film 23 on the amorphous silicon film 22, and it is maintained as it is for a duration of 5 minutes. Spin drying at 2,000 rpm is effected for 60 seconds thereafter (FIGS. 1(C) and 1(D)).

It is practically sufficient if the concentration of nickel in the acetate solution is 1 ppm or more, and preferably, 10 ppm or more. In case a non-polar solvent, for instance, a toluene solution containing nickel 2-ethylhexanoate, is used, the oxide film 23 need not be incorporated because the solution can be directly applied to the thin-film amorphous silicon to introduce the catalyst elements into the film.

By carrying out the coating step at least once, a nickel-containing layer with a thickness of from several angstroms to several hundreds of angstroms (Å) in average after spin drying can be obtained on the surface of the thin-film amorphous silicon 12. In this case, the nickel that is present in the layer diffuses into the thin film amorphous silicon to function as a catalyst to accelerate the crystallization of the amorphous silicon. It should be noted, however, that the resulting layer is not always present as a complete film.

Then, the thin-film amorphous silicon coated with the above solution is kept as it is for a duration of 5 minutes. The final concentration of nickel in the silicon film 22 can be controlled by changing the retention time; however, the most strongest factor in controlling the nickel concentration is the concentration of the solution.

The substrate coated with the nickel-containing solution thus obtained is then transferred from the coating unit 19 to a drying unit 20 to dry the solution-coated surface. The resulting substrate is further cooled in a cooling unit 21.

The steps of the process using the apparatus illustrated in FIG. 1 are thus completed. The resulting substrate is then subjected to heat treatment at a temperature of 550° C. for a duration of 4 hours in a nitrogen atmosphere in a heating furnace. Thus, a thin film of crystalline silicon 22 can be obtained on the substrate 21.

The heat treatment can be effected at any temperature of 450° C. or higher. If a lower temperature is selected, however, the heat treatment takes much time and it results in low productivity. If the temperature is 550° C. or higher, on the other hand, a problem of a heat resistance becomes apparent.

In the present example, a method of introducing a catalyst element onto a thin-film amorphous silicon is described. However, a method of introducing a catalyst element under a thin-film amorphous silicon may be employed as well. In this case, the catalyst element is introduced onto a base film by applying the solution containing the catalyst element on the base film before depositing a thin-film amorphous silicon.

Example 2

The present example relates to a process for fabricating TFTs that are provided to each pixel of an active matrix liquid crystal display device by using a crystalline silicon film fabricated according to the Example 1. As a matter of course, the TFTs can be applied not only to liquid crystal display devices, but also to a variety of applications generally denoted as thin-film integrated circuits.

A crystalline silicon film fabricated by means of the process described in Example 1 is patterned to an island-like region 104. The island-like region 104 provides the active layer of the TFT. Silicon oxide 105 is deposited thereafter to a thickness of from 200 to 1,500 Å, specifically in this case, to 1,000 Å. The silicon oxide film also functions as a gate insulating film (FIG. 3(A)).

The silicon oxide film 105 must be fabricated with care. More specifically, the silicon oxide film is deposited through an RF plasma CVD process using TEOS as a starting material in which TEOS is decomposed and then deposited together with oxygen at a substrate temperature in the range of from 150 to 600° C., preferably in the range of from 300 to 450° C. TEOS and oxygen are introduced at a pressure ratio of 1:1 to 1:3 under a pressure of from 0.05 to 0.5 Torr, while applying an RF power of from 100 to 250 W. Otherwise, the silicon oxide film can be fabricated by reduced pressure CVD or normal pressure CVD using TEOS as the starting gas together with gaseous ozone with a substrate temperature in the range of from 350 to 600° C., preferably, in the range of from 400 to 550° C. The film thus deposited is annealed in gaseous oxygen or ozone in the temperature range of from 400 to 600° C. for a duration of from 30 to 60 minutes.

The crystallization of the silicon region 104 can be accelerated by radiating a laser beam using a KrF excimer laser (operating at a wavelength of 248 nm and at a pulse width of 20 nsec) or by radiating an intense light equivalent thereto. The application of RTA (rapid thermal annealing) using infrared radiation is particularly effective because the silicon film can be heated selectively without heating the glass substrate. Moreover, RTA is especially useful in the fabrication of an insulated gate field effect semiconductor device, because it decreases the interface states between the silicon layer and the silicon oxide film.

Subsequently, an aluminum film is deposited to a thickness of from 2,000 Å to 1 μm by electron beam vapor deposition. The resulting aluminum film is patterned to form a gate electrode 106. The aluminum film may contain from 0.15 to 0.2% by weight of scandium (Sc) as a dopant. The substrate is then immersed into an ethylene glycol solution controlled to a pH of about 7 and containing from 1 to 3% tartaric acid to effect anodic oxidation using platinum as the cathode and the aluminum gate electrode as the anode. The anodic oxidation is effected by first increasing the voltage to 220 V with a current kept constant, and then holding the voltage at 220 V for 1 hour to complete the oxidation. In the condition of the constant current, the voltage is preferably increased at a rate of from 2 to 5 V/minute. Thus, in this manner, an anodic oxide 109 is formed at a thickness of from 1,500 to 3,500 Å, for example, 2,000 Å [FIG. 3(B)].

An impurity element (specifically, in this case, phosphorus) is implanted into the island-like silicon film of each of the TFTs in a self-aligned manner by ion doping (plasma doping) using the gate electrode portion as a mask. Phosphine ($PH_3$) is used as the doping gas. The dose is from $1-4\times10^{15}$ $cm^{-2}$.

The crystallinity of the portion in which the crystallinity was impaired by the incorporation of impurities is recovered by radiating a laser beam using a KrF excimer laser operating at a wavelength of 248 nm and a pulse width of 20 nsec. The laser is operated at an energy density of from 150 to 400 $mJ/cm^2$, preferably, in a range of from 200 to 250 $mJ/cm^2$. Thus are formed N-type impurity regions (regions doped with phosphorus) 108 and 109. The sheet resistance of the regions is found to be in the range of from 200 to 800 Ω/square.

This step of laser annealing can be replaced by an RTA process, i.e., a rapid thermal annealing process using a flash lamp, where the temperature of a sample is rapidly raised to a range of from 1,000 to 1,200° C. (as measured on the silicon monitor). This method of annealing is also called as RTP (rapid thermal process).

A silicon oxide film is deposited thereafter to a thickness of 3,000 Å as an interlayer dielectric 110 by means of plasma CVD using TEOS together with oxygen, or by means of reduced pressure CVD or normal pressure CVD using TEOS together with ozone. The substrate temperature is maintained in the range of from 250 to 450° C., for instance, at 350° C. A smooth surface is obtained thereafter by mechanically polishing the resulting silicon oxide film. An ITO coating is deposited thereon by sputtering, and is patterned to provide a pixel electrode 111 (FIG. 3(D)).

The interlayer dielectric 110 is etched to form contact holes on the source/drain as shown in FIG. 3(E), and interconnections 112 and 113 are formed using chromium or titanium nitride to connect the interconnection 113 to the pixel electrode 111.

The crystalline silicon films containing nickel incorporated by plasma treatment were apt to be etched during the step of forming contact holes. This is due to the low selectivity of the silicon film for buffered hydrofluoric acid as compared with the selectivity of the silicon oxide film for the acid.

However, in the case that nickel is incorporated into the silicon film by using an aqueous solution containing nickel at a low concentration of 10 ppm as in the present embodiment, the silicon film has a high resistance against hydrofluoric acid, and contact holes can be formed stably and with high reproducibility.

A complete TFT can be implemented by finally annealing the silicon film in hydrogen at a temperature range from 300 to 400° C. for a duration of from 0.1 to 2 hours to accomplish the hydrogenation of the silicon film. A plurality of TFTs are fabricated simultaneously, and are arranged in a matrix to implement an active matrix liquid crystal display device. The TFT has source/drain regions 108/109 and a channel forming region 114. Also, an NI electric junction 115 is also formed in the structure.

The TFT fabricated according to the constitution of the present invention assumably comprises an active layer containing nickel at a concentration of about $3\times10^{18}$ $atoms/cm^3$ or lower, more specifically, at a concentration in the range of from $1\times10^{16}$ $atoms/cm^3$ to $3\times10^{18}$ $atoms/cm^3$.

Effect

The process according to the present invention provides a crystalline silicon film at a low temperature and at high productivity.

In the example above, a layer containing a catalyst was formed on the surface of a thin-film amorphous silicon. However, it should be noted that, in the scope of the present invention, is also a process which comprises forming previously a layer containing the catalyst on the substrate and then depositing thereon a thin-film amorphous silicon.

EXPLANATION OF THE SYMBOLS

Figure 1:
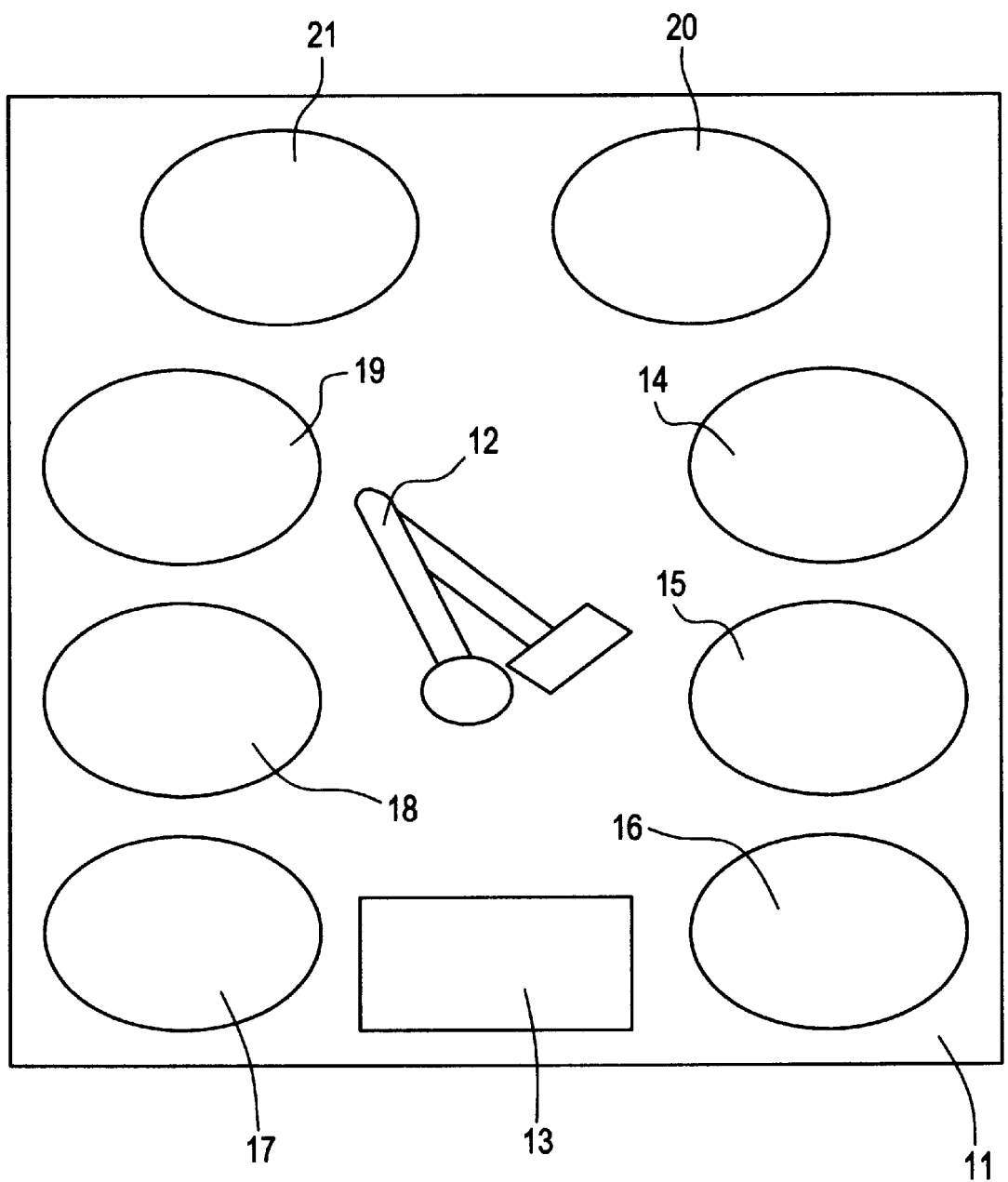
FIG. 1 shows a construction of an embodiment.
Figure 2A:
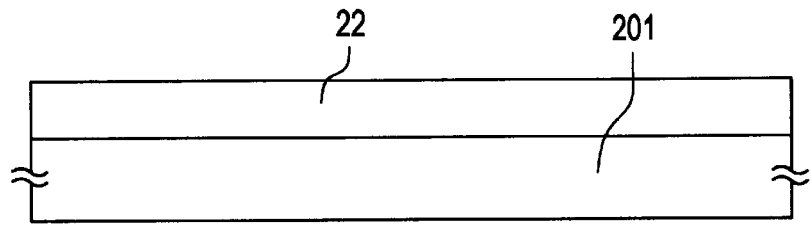
FIG. 2 shows a manufacturing process of an embodiment.
Figure 2B:
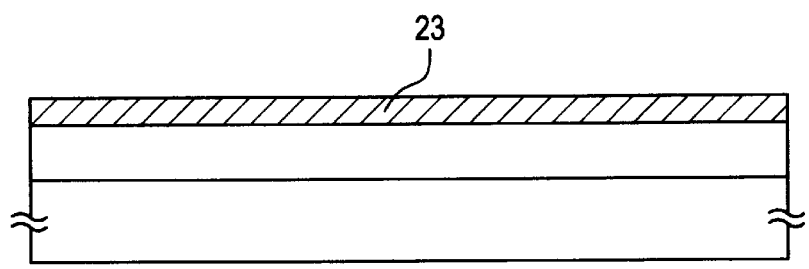
Figure 2C:
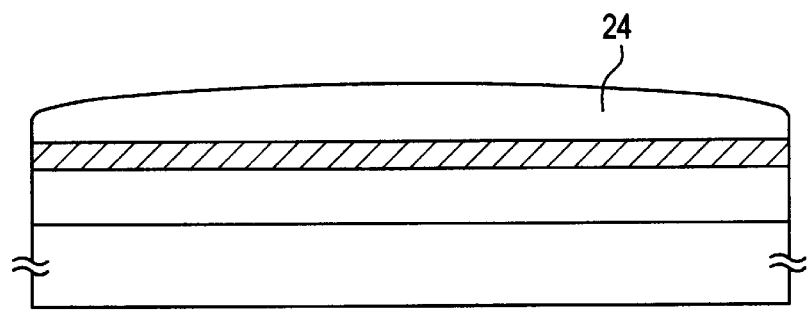
Figure 2D:
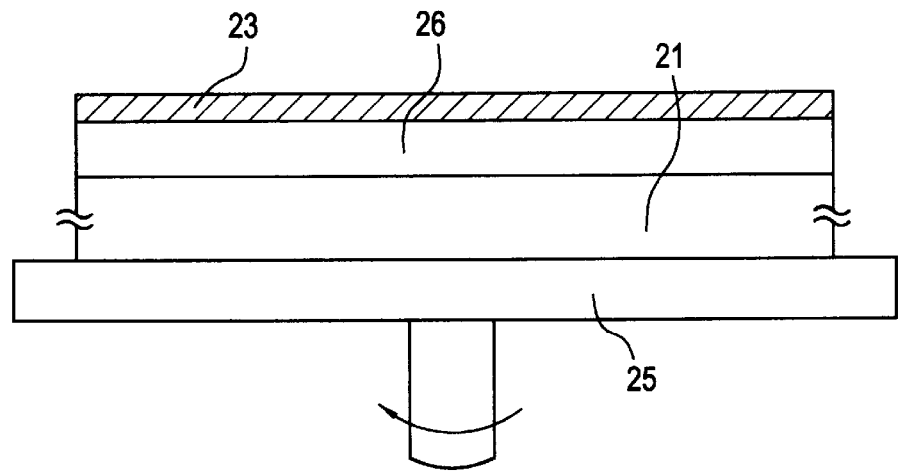
Figure 3A:
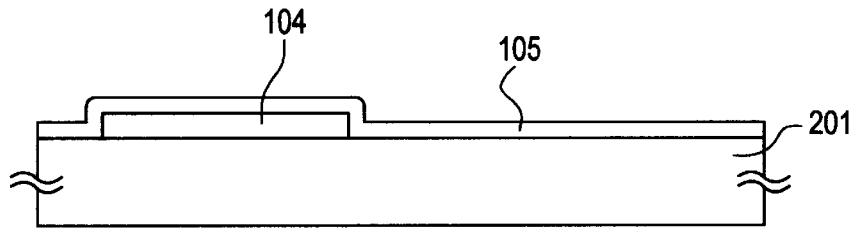
FIG. 3 shows a manufacturing process of an embodiment.
Figure 3B:
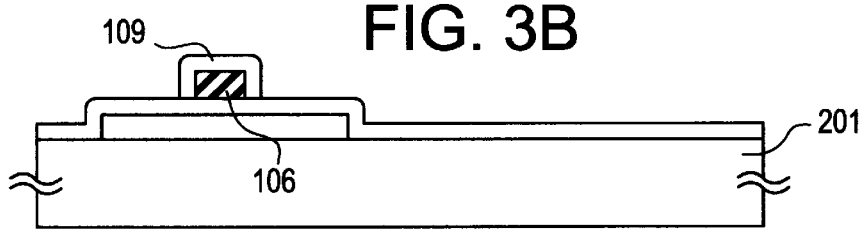
Figure 3C:
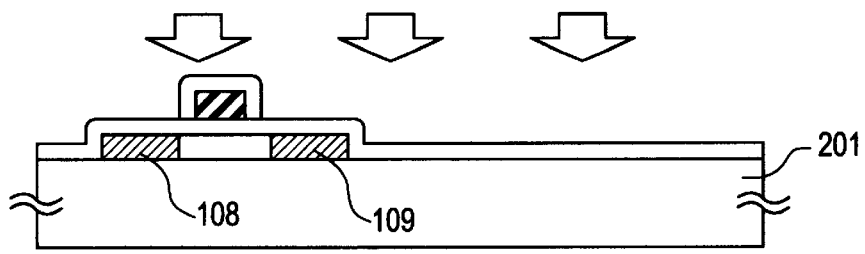
Figure 3D:
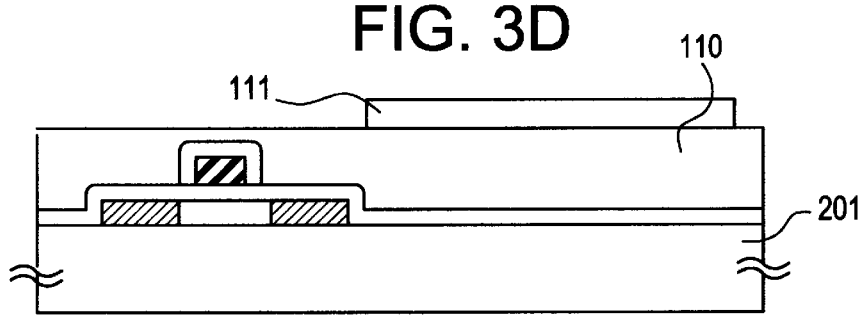
Figure 3E:
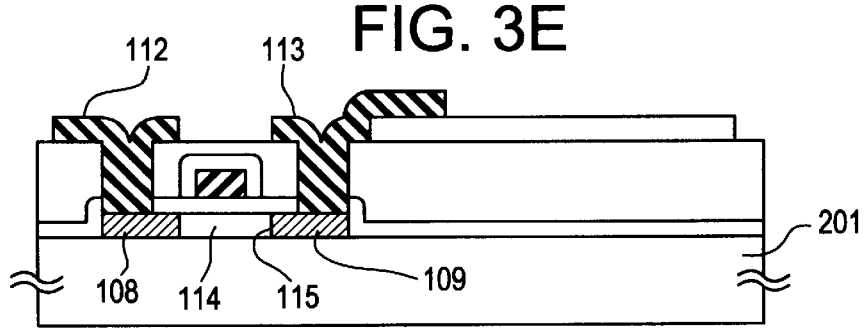

11—Base foundation
12—Robot arm
13—Carrier
14—Cleaning unit
15—Drying unit
16—Cooling unit
17—Oxidizing unit
18—Positioning unit
19—Coating unit
20—Drying unit
21—Cooling unit
201—Glass substrate
22—Silicon film
23—Oxide film
25—Spinner These are some methods to perform solid phase crystallization by using a metal catalyst. In using such metal catalyst elements, including Ni, Fe, Co, Ru, Rh, Pd, Os, Ir, Pt, Cu, Au, etc., the conventional method was physical formation such as sputtering method, electron beam evaporation method, etc.

In this case, a film including the catalyst of 5 to 200 Å in average thickness, e.g. 10 to 50 Å thick is formed in an island-form on a surface. That is, the catalyst element is dotted on the surface in the form of micrograins with an average diameter of 50 to 200 Å. The grain are separated from each other by approximately 100 to 1000 Å. In other words, it does not form a continuous film in any way, but forms a discontinuous film. Consequently, the metal islands form nuclei for crystallization. Crystals are grown from the nuclei in an amorphous silicon film on an insulating substrate by means of a thermal treatment at 450° C. to 600° C.

In the above conventional method, the crystallization temperature can be dropped by 50 to 100° C., in comparison to when such catalyst elements are not used for the crystallization. However, the following thing became clear as a result of observing the crystallized film carefully. A number of amorphous regions are left and that such regions have a metallic property. It is presumed that the metal catalyst is left as they are.

These metal regions form recombination centers of electrons and halls. Adding a reverse bias voltage to a semiconductor device, in particular, PI or NI junction because of the metal region existing in the junction region, it has quite inferior characteristics in that a leak current is increased. When thin-film transistors of channel length/channel width=8 $\mu$m/8 $\mu$m is formed with such a semiconductor layer, the Off-state current is $10^{-10}$ to $10^{-6}$ A, which is $10^2$ to $10^6$ times larger than $10^{12}$ although an OFF=-state current should be as small as about $10^{12}$ A.

The present invention aims at giving the chemical formation method which is quite different from above. In order to solve the problem above, it is a characteristic of the present invention to form a catalytic layer by using a solution (water, isopropyl alcohol, etc.) which contains a metal organic compound at a concentration 10 ppm to 100 ppm. For example, the following metal complex salt can be used as the metal compound. Namely, ferrous bromide ($FeBr_2 6H_2O$), ferric bromide ($FeBr_3 6H_2O$), ferric acetate ($Fe(C_2H_3O_2)_3 xH_2O$), ferrous chloride ($FeCl_2 4H_2O$), ferric chloride ($FeCl_3 6H_2O$), ferric fluoride ($FeF_3 3H_2O$), ferric nitrate ($Fe(NO_3)_3 9H_2O$), ferrous phosphate ($Fe_3(O_4)_2 8H_2O$), ferric phosphate ($FePO_4 2H_2O$), cobalt bromide ($CoBr 6H_2O$), cobalt acetate ($Co(C_2H_3O_2)_2 4H_2O$), cobalt chloride ($CoCl_2 6H_2O$), cobalt fluoride ($CoF_2 xH_2O$), cobalt nitrate ($Co(NO_3)_2 6H_2O$), ruthenium chloride ($RuCl_3 H_2O$), rhodium chloride ($RhCl_3 3H_2O$), palladium chloride ($PdCl_2 2H_2O$), osmium chloride ($OsCl_3$), iridium trichloride ($IrCl_3 3H_2O$), iridium tetrachloride ($IrCl_4$), platinic chloride ($PtCl_4 5H_2O$), cupric acetate ($Cu(CH_3COO)_2$), cupric chloride ($CuCl_2 2H_2O$), cupric nitrate ($Cu(NO_3)_2 3H_2O$), auric trichloride ($AuCl_3 xH_2O$), auric chloride ($AuHCl_4 4H_2O$), sodium auric tetrachloride ($AuNaCl_4 2H_2O$).

The above materials can be dispersed in a solution in a monomolecular form. This solution can be spread on an entire surface of a substrate by spin coating in which the solution is dropped and then the substrate is rotated at a rotational speed of 50 to 500 r.p.m.

When a silicon oxide film of 5 to 100 Å thick is formed on the surface of a silicon semiconductor in order to improve a wettability of the silicon surface with respect to the solution, this thin film can prevent the solution from becoming spot condition by the surface tension of liquid. It is also practicable to improve the wettability of semiconductor silicon without a silicon oxide film by adding a surface active agent into the solution.

In these methods, the metal catalyst atoms can be dispersed into semiconductor through the oxide film. In particular, it is possible to promote a crystallization without forming crystal nuclei in the form of grains. Therefore, it is a favorable method.

It is also useful to coat the organic metal uniformly and a UV treatment (ozone treatment) in oxygen is performed for formation of a metal oxide film. In this case, oxidized organic substance can be vaporized and removed as carbon dioxide, so it is possible to make the solid phase growth more uniform.

When the spin coating is carried out only at low rational speed, too much metal constituent for solid phase growth is apt to be supplied into the semiconductor film. Therefore, after the rotation at a low speed, the substance is rotated at 1000 to 10,000 r.p.m., e.g., 2000 to 5000 r.p.m. Thus, an excess organic metal can be eliminated from the surface of substrate and the surface can be dried sufficiently. Moreover, it is effective to control the amount of the organic metal to be formed on the surface. In the above chemical formation method, a continuous layer can be formed on a surface of semiconductor without forming nuclei of metal particles for crystallization.

A metal catalyst layer becomes inhomogeneous layer when it is formed by a physical formation method, on the other hand, it becomes homogeneous layer when it is formed by a chemical method as is the case in the present invention.

In accordance with the above new concept, the crystals can be grown far more uniformly on an entire surface of the semiconductor film when the crystallization is performed by thermal treatment which is performed at 450° C. to 650° C. Therefore, it is possible to form excellent P-I and N-I junctions by using the thus crystallized semiconductor film. In this case, the leak is controlled to be as small as $10^{-12}$ A even if a reverse bias voltage is applied.

In the case of a physical method, 90 to 100 out of 100 P-I junctions have a large leak current, that is $10^{-10}$ to $10^{-5}$ A and 50 to 70 out of 100 N-I junctions have $10^{-12}$ to $10^{-6}$ leak current. On the other hand, in the chemical method of the present invention, 5 to 20 out of 100 P-I junctions have a leak current as small as $10^{-13}$ to $10^{-8}$ A and 0 to 20 out of 100 N-I junctions have a leak current as small as $10^{-13}$ to $10^{-8}$ A. So, the present invention improves the characteristics quite remarkably because both an OFF-state current and the probability of a film that leak current is large are reduced.

Besides, the fine effect can be obtained in both P-channel TFTs (having a PIP junctions) and N-channel TFTs (having a NIN junctions) by forming the above semiconductor film on an insulating surface. Moreover, the present invention can reduce the probability by about 1 or 2 orders that TFTs having large leak current are formed. However, if the TFTs are used for making thin film IC, the probability which TFTs having large current are formed should be decreased $\frac{1}{10^3}$ to $\frac{1}{10^9}$.

In the present invention, after the thermal crystallization, a laser light having a wavelength 248 nm or 308 nm is irradiated on the surface of the semiconductor with the energy density being at 250 to 400 mJ/cm$^2$. The absorption of light is larger in the region that metal constituent exist largely compared to the silicon region crystallized. That is, the region which remains an amorphous structure becomes black optically while the crystal constituent is transparent. Because of this, the slightly remaining amorphous component can be melted by the irradiation of the laser light selectively. Further, the metal existing in the amorphous component can be dispersed to an atomic level in this manner.

As a result, it was possible to reduce the possibility that the metal regions are formed within a recrystallized film, and it was possible to reduce the leak current of a TFT to $10^{-13}$ to $10^{-12}$ A, and further, when $10^4$ to $10^8$ pieces of TFTs were manufactural, only 1–3 of them had an undesirable large leak current. This is because the metal regions which form recombination centers and cause the increase in a leak current are removed from the semiconductor film.

By spin coating in the present method, the leak current of the reversed direction i.e. Ioff is reduced by two orders, and the probability which TFTs having a large leak current exist can be reduced by two orders. Nevertheless, TFTs having a large leak current are formed. Assumably, the cause of forming such defective TFT's is that dust adheres to the surface of the semiconductor, on which organic metal concentrates. The characteristic can be improved by the improvement of experimental equipment.

An experiment was conducted in which laser light was irradiated to a film which was obtained by forming a catalyst metal through a conventional physical formation method and heat crystallizing. In this case, however, an OFF current could not be reduced at all at P-I or N-I junctions when a reverse bias voltage was applied, even if the semiconductor is fused by the irradiation of laser light for recrystallization because metal grains in the starting film tend to be too big.

Accordingly, the method which utilizes a chemical formation method for forming a continuous layer of an organic metal catalyst is entirely different from the conventional method which utilizes a physical formation method followed by a thermal crystallization process. It is clearly understood that the chemical formation method is superior.

Instead of using a solution for forming the continuous catalyst layer, it is possible to utilize a CVD method with an organic metal gas as a starting material. The method is quite effective in order to reduce both an OFF current and the probability which TFTs having a large leak current exist. Further, the process of the present invention is a homogeneous crystal growth, that is, isotropic growth by using metal catalyst. On the other hand, the process of the conventional method is a non-uniform crystal growth, that is, a non-isotropic growth by using metal nuclei.

In the present invention, there are two ways as to how the crystal growth occurs; one is that the crystals are grown in the transverse direction with the surface of the substrate and the other is that the crystals are grown in the vertical direction with the surface of the substrate from the lower side of the semiconductor to the upper side thereof or vice versa. In either case, it was possible to obtain a semiconductor having an excellent electrical characteristics.

What is claimed is:

1. A process for fabricating a semiconductor device comprising:
    transferring a substrate into a first unit which is designed for oxidizing the surface of a substrate, using a substrate transfer means, and oxidizing a surface of the substrate; and then
    transferring the substrate from the first unit into a second unit which is designed for coating the surface of the substrate with a solution containing a catalyst element which accelerates the crystallization of a semiconductor film by means of the substrate transfer means, and coating the surface of the substrate with said solution to provide a continuous layer thereon,
    wherein said first unit, said substrate transfer means, and said second unit are located in the same apparatus.

2. A process for fabricating a semiconductor according to claim 1, wherein the substrate is provided with the semiconductor film thereon.

3. A method according to claim 1, wherein said catalyst element is at least one selected from the group consisting Ni, Pd, Pt, Cu, Ag, Au, In, Sn, P, As, and Sb.

4. A method according to claim 1, wherein said catalyst element is at least one selected from Groups VIII, IIIb, IVb, and Vb of a periodic table.

5. A method according to claim 1, wherein the coating step is carried out at least once.

6. A method according to claim 1, wherein the apparatus is wholly covered with a clean booth.

7. A method according to claim 1, wherein a thin oxide layer formed by oxidizing the surface of the substrate has a thickness not thicker than 100 Å.

8. A method according to claim 1, wherein said solution is at least one selected from the group consisting of a polar solvent, a non-polar solvent, and a surface active agent.

9. A method according to claim 1, wherein the oxidizing step is carried out by ozone generated using an ultraviolet irradiation.

10. A method according to claim 1, wherein the oxidizing step is carried out by an oxidizing solution such as hydrogen peroxide.

11. A method according to claim 1, wherein said semiconductor film is an amorphous silicon film.

12. A process for fabricating a semiconductor device comprising:
    transferring a substrate into a first unit which is designed for oxidizing the surface of a substrate, using a substrate transfer means, and oxidizing a surface of the substrate; and then
    transferring the substrate from the first unit into a second unit which is designed for coating the surface of the substrate with a solution containing a catalyst element which accelerates the crystallization of a semiconductor film by means of the substrate transfer means, and coating the surface of the substrate with said solution,
    wherein said first unit, said substrate transfer means, and said second unit are located in the same apparatus.

13. A process for fabricating a semiconductor according to claim 12, wherein the substrate is provided with the semiconductor film thereon.

14. A method according to claim 12, wherein said catalyst element is at least one selected from the group consisting Ni, Pd, Pt, Cu, Ag, Au, In, Sn, P, As, and Sb.

15. A method according to claim 12, wherein said catalyst element is at least one selected from Groups VIII, IIIb, IVb, and Vb of a periodic table.

16. A method according to claim 12, wherein the coating step is carried out at least once.

17. A method according to claim 12, wherein the apparatus is wholly covered with a clean booth.

18. A method according to claim 12, wherein a thin oxide layer formed by oxidizing the surface of the substrate has a thickness not thicker than 100 Å.

19. A method according to claim 12, wherein said solution is at least one selected from the group consisting of a polar solvent, a non-polar solvent, and a surface active agent.

20. A method according to claim 12, wherein the oxidizing step is carried out by ozone generated using an ultraviolet irradiation.

21. A method according to claim 12, wherein the oxidizing step is carried out by an oxidizing solution such as hydrogen peroxide.

22. A method according to claim 12, wherein said semiconductor film is an amorphous silicon film.

23. A method for fabricating a semiconductor device comprising the steps of:
    forming a semiconductor film comprising silicon over a substrate;
    preparing an apparatus comprising
        a carrier unit located on a base, said carrier unit for placing the substrate thereon,
        at least an oxidizing unit located on the base, said oxidizing unit being for oxidizing a surface of the substrate,
        a positioning unit located on the base, said positioning unit being for positioning the substrate, at least a coating unit located on the base, said coating unit being for coating the surface of the substrate with a solution, at least a drying unit located on the substrate, said drying unit being for drying the substrate, at least a cooling unit located on the base, said cooling unit being for cooling the substrate, and a transferring means located on the base, said transferring means being for transferring the substrate from one of said units to another of said units;

transferring said substrate into said oxidizing unit by said transferring means;

oxidizing said substrate to form a thin oxide layer on the surface of the semiconductor film in said oxidizing unit, said thin oxide layer being capable of distributing a catalyst material into the entire surface of the semiconductor film;

transferring said substrate into the coating unit by said transferring means; and forming a solution containing a catalyst material in contact with the surface of said semiconductor film to provide a continuous layer on the surface of said semiconductor film, said catalyst material being capable of promoting the crystallization of said silicon.

24. A method according to claim 23 wherein said silicon is amorphous.

25. A method according to claim 23 wherein said solution comprises a nickel solution.

26. A method according to claim 23, wherein said catalyst material is at least one selected from the group consisting Ni, Pd, Pt, Cu, Ag, Au, In, Sn, P, As, and Sb.

27. A method according to claim 23, wherein said catalyst material is at least one selected from Groups VIII, IIIb, IVb, and Vb of a periodic table.

28. A method according to claim 23, wherein the step of forming the solution containing the catalyst material is carried out at least once.

29. A method according to claim 23, wherein the apparatus is wholly covered with a clean booth.

30. A method according to claim 23, wherein the oxide layer has a thickness not thicker than 100 Å.

31. A method according to claim 23, wherein said solution is at least one selected from the group consisting of a polar solvent, a non-polar solvent, and a surface active agent.

32. A method according to claim 23, wherein the oxidizing step is carried out by ozone generated using an ultraviolet irradiation.

33. A method according to claim 23, wherein the oxidizing step is carried out by an oxidizing solution such as hydrogen peroxide.

* * * * *